(12) United States Patent
Pádár et al.

(10) Patent No.: US 12,195,080 B2
(45) Date of Patent: Jan. 14, 2025

(54) ANGLE SENSOR HAVING A MULTIPOLE MAGNET FOR A MOTOR VEHICLE STEERING SYSTEM

(71) Applicants: thyssenkrupp Presta AG, Eschen (LI); thyssenkrupp AG, Essen (DE)

(72) Inventors: Péter Pádár, Budapest (HU); Ábel Vér, Solymár (HU)

(73) Assignees: thyssenkrupp Presta AG, Eschen (LI); thyssenkrupp AG, Essen (DE)

( * ) Notice: Subject to any disclaimer, the term of this patent is extended or adjusted under 35 U.S.C. 154(b) by 765 days.

(21) Appl. No.: 17/293,679

(22) PCT Filed: Nov. 21, 2019

(86) PCT No.: PCT/EP2019/082097
§ 371 (c)(1),
(2) Date: May 13, 2021

(87) PCT Pub. No.: WO2020/104593
PCT Pub. Date: May 28, 2020

(65) Prior Publication Data
US 2022/0001924 A1  Jan. 6, 2022

(30) Foreign Application Priority Data
Nov. 22, 2018 (DE) ...................... 10 2018 129 487.5

(51) Int. Cl.
*G01D 5/00* (2006.01)
*B62D 15/02* (2006.01)
(Continued)

(52) U.S. Cl.
CPC ........... *B62D 15/0215* (2013.01); *G01B 7/30* (2013.01); *G01D 5/145* (2013.01); *G01R 33/072* (2013.01)

(58) Field of Classification Search
None
See application file for complete search history.

(56) References Cited

U.S. PATENT DOCUMENTS

| 4,369,405 A | 1/1983 | Sato et al. |
| 4,803,629 A | 2/1989 | Noto et al. |

(Continued)

FOREIGN PATENT DOCUMENTS

| CN | 102893131 A | 1/2013 |
| CN | 107870002 A | 4/2018 |

(Continued)

OTHER PUBLICATIONS

English Translation of International Search Report issued in PCT/EP2019/082097, dated May 13, 2020.

(Continued)

*Primary Examiner* — Jamel E Williams
(74) *Attorney, Agent, or Firm* — thyssenkrupp North America, LLC

(57) ABSTRACT

An angle sensor unit for measuring a rotational angle of a rotational position of a steering shaft of a motor vehicle may include a multipole magnetic ring that has a number of pole pairs and can be connected in a torque-proof manner to the steering shaft, at least two magnetic field sensors that are assigned to the multipole magnetic ring, and an evaluation unit that is configured to determine a rotational angle on the basis of the signals of the at least two magnetic field sensors. The at least two magnetic field sensors may be offset in a circumferential direction on an outside of the multipole magnetic ring such that a magnetic field that originates from the multipole magnetic ring, in a region of the two magnetic field sensors, has an approximate equal absolute value with opposite signs.

20 Claims, 4 Drawing Sheets

(51) Int. Cl.
*G01B 7/30* (2006.01)
*G01D 5/14* (2006.01)
*G01R 33/07* (2006.01)

(56) References Cited

U.S. PATENT DOCUMENTS

| | | | | |
|---|---|---|---|---|
| 5,568,048 | A * | 10/1996 | Schroeder | G01D 5/145 |
| | | | | 324/252 |
| 5,680,042 | A * | 10/1997 | Griffen | G01P 3/487 |
| | | | | 324/207.21 |
| 2003/0145663 | A1* | 8/2003 | Heisenberg | G01D 5/2451 |
| | | | | 73/862.324 |
| 2008/0027672 | A1* | 1/2008 | Desbiolles | G01D 5/145 |
| | | | | 702/145 |
| 2008/0180684 | A1* | 7/2008 | Chalmers | G01B 11/0625 |
| | | | | 356/504 |
| 2008/0180864 | A1 | 7/2008 | Meguro | |
| 2009/0320613 | A1 | 12/2009 | Uehira et al. | |
| 2011/0175600 | A1 | 7/2011 | Jerance et al. | |
| 2012/0038359 | A1 | 2/2012 | Saruki et al. | |
| 2012/0161755 | A1* | 6/2012 | Masson | G01D 5/145 |
| | | | | 324/207.25 |
| 2013/0179147 | A1 | 7/2013 | Alkharashi | |
| 2014/0292313 | A1 | 10/2014 | Ueda et al. | |
| 2014/0292314 | A1 | 10/2014 | Tokida et al. | |
| 2017/0328701 | A1* | 11/2017 | Ausserlechner | G01B 7/004 |
| 2018/0087927 | A1 | 3/2018 | Anagawa et al. | |
| 2018/0274896 | A1 | 9/2018 | Anagawa et al. | |
| 2020/0116527 | A1 | 4/2020 | Anagawa et al. | |

FOREIGN PATENT DOCUMENTS

| | | | | |
|---|---|---|---|---|
| CN | 108627081 | A | 10/2018 | |
| DE | 199 08 361 | A | 9/2000 | |
| DE | 100 42 006 | A | 3/2002 | |
| DE | 102 10 372 | A | 9/2003 | |
| DE | 10 2004 004 024 | A | 11/2004 | |
| DE | 103 31 580 | A | 1/2005 | |
| DE | 10 2008 043 265 | A | 5/2010 | |
| DE | 20 2014 002 597 | U | 6/2014 | |
| DE | 10 2014 103 588 | A | 10/2014 | |
| DE | 10 2015 114 608 | A | 3/2016 | |
| DE | 102015114608 | A1 * | 3/2016 | G01D 5/145 |
| EP | 1 777 501 | A | 4/2007 | |
| EP | 1777501 | A1 * | 4/2007 | G01D 3/08 |
| EP | 1 818 659 | A | 8/2007 | |
| EP | 2 552 000 | A | 1/2013 | |
| JP | 2014-142322 | A | 8/2014 | |
| WO | 2018/008628 | A | 9/2018 | |

OTHER PUBLICATIONS

K. Reif (Hrsg.) Sensoren im Kraftfahrzeug, Bosch Fachinformation Automobil, ISBN 978-3-8348-1778-5, pp. 71-73, (2012). [English translation unavailable].

* cited by examiner

ANGLE SENSOR HAVING A MULTIPOLE MAGNET FOR A MOTOR VEHICLE STEERING SYSTEM

CROSS REFERENCE TO RELATED APPLICATIONS

This application is a U.S. National Stage Entry of International Patent Application Serial Number PCT/EP2019/082097, filed Nov. 21, 2019, which claims priority to German Patent Application No. DE 10 2018 129 487.5, filed Nov. 22, 2018, the entire contents of both of which are incorporated herein by reference.

FIELD

The present disclosure generally relates to steering systems, including angle sensors for electromechanical power steering systems and steer-by-wire steering systems for motor vehicles.

BACKGROUND

Angle sensors are used in a motor vehicle inter alia, to measure the steering angle of the steering wheel. Currently used angle sensors are magnetic sensors whose measurement can be very easily disrupted by external magnetic fields. Motor vehicles will in future be operated completely or partially electrically and are already to a certain extent, which can give rise to high external field effect measurements as a result of cables which conduct high currents and are frequently located in the vicinity of the steering system. This interference applied to the magnetic sensors can therefore have an adverse effect on the steering sensation and the robustness of the steering system.

EP 2 552 000 A2 discloses an electric motor with a rotor position sensor which senses a leakage magnetic field of the rotor which is embodied in a permanent and magnetic fashion, said sensor generating the rotator position signal as a function of the leakage magnetic field. The electric motor therefore advantageously does not need a separate rotor position magnet in order to sense the rotor position of the rotor. It is additionally known, from published patent application DE 10 2008 043 265 A1, to compensate the interference caused by a magnetic interference field by determining the magnetic interference field and subtracting it vectorially from a magnetic field vector.

Thus, a need exists for an angle sensor which has an increased accuracy level and reduced influence of an existing magnetic interference field on the determination of the rotational angle value.

DETAILED DESCRIPTION

Figure 1:
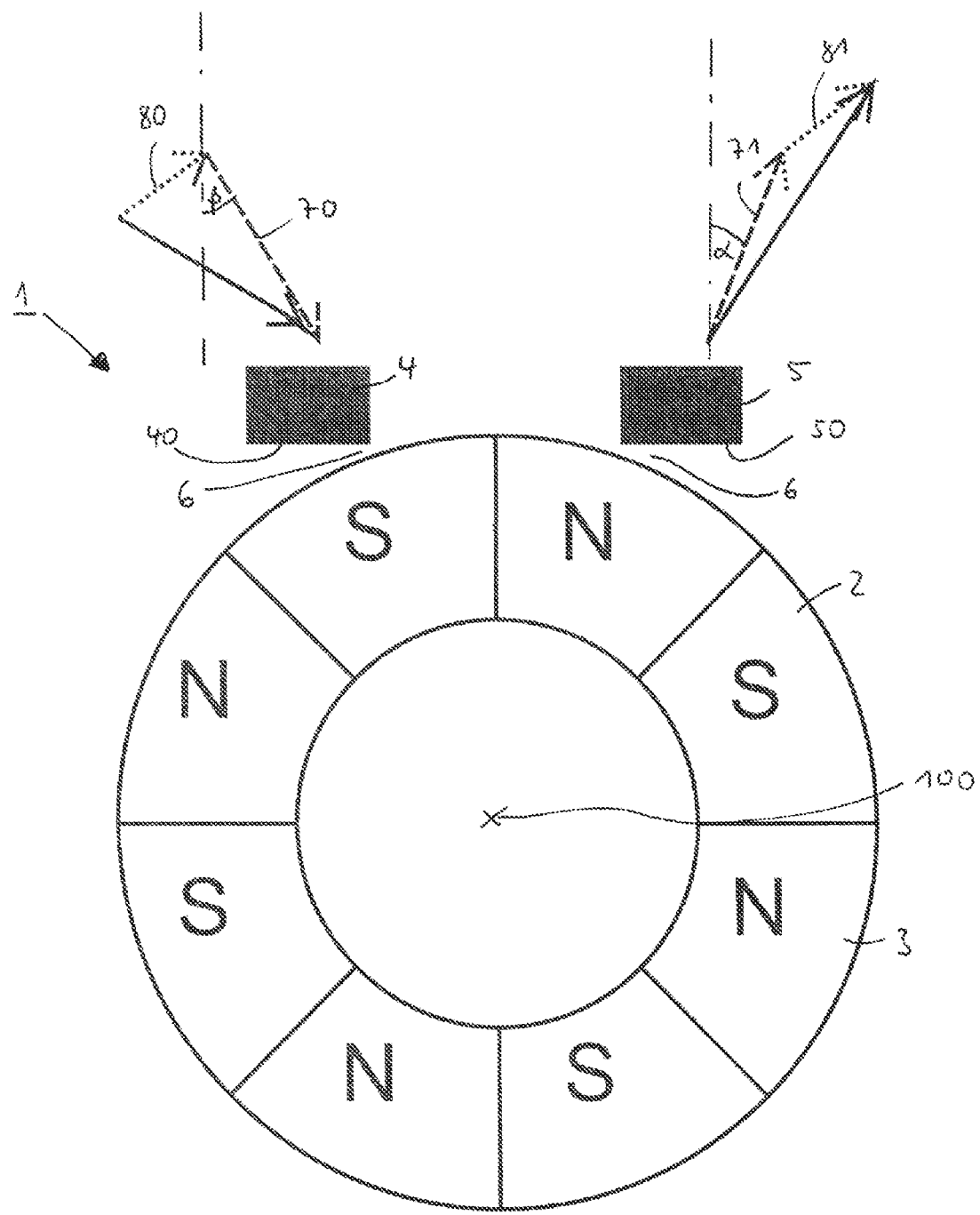
FIG. 1 is a schematic view of an example steering angle sensor with two sensors and a multipole magnetic ring.

Although certain example methods and apparatus have been described herein, the scope of coverage of this patent is not limited thereto. On the contrary, this patent covers all methods, apparatus, and articles of manufacture fairly falling within the scope of the appended claims either literally or under the doctrine of equivalents. Moreover, those having ordinary skill in the art will understand that reciting "a" element or "an" element in the appended claims does not restrict those claims to articles, apparatuses, systems, methods, or the like having only one of that element, even where other elements in the same claim or different claims are preceded by "at least one" or similar language. Similarly, it should be understood that the steps of any method claims need not necessarily be performed in the order in which they are recited, unless so required by the context of the claims. In addition, all references to one skilled in the art shall be understood to refer to one having ordinary skill in the art.

The present disclosure generally relates to angle sensors, to electromechanical power steering systems, to steer-by-wire steering systems for motor vehicles that have corresponding angle sensors, and to methods for determining a rotational angle of a rotational position of a rotatably mounted steering shaft of a motor vehicle.

Accordingly, an angle sensor unit is provided for measuring a rotational angle of the rotational position of a steering shaft of a motor vehicle having a multipole magnetic ring which has a number of pole pairs and can be connected in a torque-proof manner to the steering shaft, at least two magnetic field sensors which are assigned to the multipole magnetic ring and an evaluation unit which is configured to determine a rotational angle on the basis of the signals of the at least two magnetic field sensors, wherein the at least two magnetic field sensors are arranged offset in the circumferential direction on the outside of the multipole magnetic ring, in such a way that a magnetic field which originates from the multipole magnetic ring, in the region of the two magnetic field sensors, has an approximate equal absolute value but opposite signs. This arrangement makes it possible to eliminate leakage field interference through differential measurements of the two magnetic field sensors and therefore to determine an interference-free rotational angle.

The sensitive sensor faces of the two sensors preferably are in a plane which extends tangentially with respect to the outer face of the multipole magnetic ring, in the center between the two sensors. The vectorial magnetic flux of the magnetic field which is generated by the multipole magnetic ring encloses the same angle in terms of absolute value with the plane of the sensor face, i.e. $|\alpha|=|\beta|$. An external magnetic interference field is preferably homogeneous in the region of the two sensors.

The magnetic field sensors are preferably spaced apart by a distance of less than 45°, in particular less than 20°, in the circumferential direction.

In one advantageous embodiment, the magnetic field sensors are arranged offset by one pole in the circumferential direction. This ensures that the interference field is homogeneous in the region of the two sensors and can be eliminated by calculation by means of a differential measurement.

The sensitive sensor faces of the magnetic field sensors preferably lie in a plane and are spaced apart by a distance in a range between 40% and 90% of the diameter of the multipole magnetic ring.

The multipole magnetic ring preferably has at least four pole pairs.

The evaluation unit is preferably configured to determine a rotational angle independently of an external magnetic interference field by forming differences between the signals of the two magnetic field sensors.

In order to determine absolute angles over one revolution it is possible to add a two-pole magnetic ring with an assigned magnetic field sensor of the arrangement.

The poles of the multipole magnetic ring are preferably formed by permanent magnets and/or the magnetic field sensors are Hall sensors or xMR sensors.

In a further embodiment, an angle sensor unit is provided for measuring a rotational angle of the rotational position of a steering shaft of a motor vehicle having two multipole magnetic rings which have an equal number of pole pairs and a common axis of symmetry and can be connected in a torque-proof manner to the steering shaft, two magnetic field sensors, wherein in each case one magnetic field sensor is assigned to a multipole magnetic ring, and an evaluation unit which is configured to determine a rotational angle on the basis of the signals of the two magnetic field sensors, wherein the multipole magnetic rings are arranged offset with respect to one another by one pole in the circumferential direction, and the two magnetic field sensors are arranged on the respective outer side of the multipole magnetic ring at the same position in the circumferential direction and at a short distance from one another in the axial direction. The distance between the two magnetic field sensors and the magnetic field which is formed in the region of the sensors are configured in such a way that an interference-free rotational angle can be measured by measuring differences. The two multipole magnetic rings are preferably identical and lie one behind the other in the axial direction, preferably in an abutting arrangement.

The multipole magnetic rings preferably each have an axial pole width, and the distance between the magnetic field sensors is less than 110% of the axial pole width and, in particular, greater than 90%.

It is preferred that the distance between the magnetic field sensors is between 40% and 60% of the total extent of the two multipole magnetic rings in the axial direction.

Furthermore, an electromechanical power steering system for a motor vehicle is provided, comprising a steering shaft which is pivoted about a steering shaft rotational axis and can take in various rotational positions, an electric motor for assisting a steering movement and an angle sensor unit as mentioned above.

The abovementioned angle sensor unit can also be used in a steer-by-wire steering system for motor vehicles having a steering actuator which acts on the steered wheels and is electronically regulated as a function of a driver's steering wheel request, a feedback actuator which transmits reactions of the road to a steering wheel, a control unit which controls the feedback actuator and the steering actuator.

Furthermore, a method is provided for determining a rotational angle of the rotational position of a rotatably mounted steering shaft of a motor vehicle with an angle sensor unit having a multipole magnetic ring which has a number of pole pairs and can be connected in a torque-proof manner to the steering shaft, a first and a second magnetic field sensor which are assigned to the multipole magnetic ring, and an evaluation unit which is configured to determine a rotational angle on the basis of the signals of the two magnetic field sensors, wherein the two magnetic field sensors are arranged offset in the circumferential direction on the outside of the multipole magnetic ring, and the method comprises the following steps:
  introducing the angle sensor unit into a magnetic interference field,
  arranging the two magnetic field sensors on the outer side of the multipole magnetic ring in such a way that the magnetic interference field is approximately homogeneous in the region of the two magnetic field sensors, and in that a magnetic field which originates from the multipole magnetic ring has, in the region of the two magnetic field sensors, an approximately equal absolute value, but opposite signs,
  measuring a magnetic field by means of the first magnetic field sensor,
  measuring a magnetic field by means of the second magnetic field sensor,
  decomposing the two measured signals into radial and tangential components,
  forming a difference between the two radial components and the two tangential components, and
  determining the rotational angle independently of an external magnetic interference field by means of an arctan function.

Such an arc tangent determination can be implemented, for example, on the basis of lookup tables, a CORDIC algorithm (CORDIC=Coordinate Rotation Digital Computer) or a similar implementation. The method provides the abovementioned advantages.

Weighting can preferably be performed during the formation of differences.

In one preferred exemplary embodiment, the magnetic field sensors are arranged offset by one pole in the circumferential direction. Further preferred configurations can also be inferred from the device described above.

There can also be provision that the method is provided for determining a rotational angle of the rotational position of a rotatably mounted steering shaft of a motor vehicle by an angle sensor unit having two multipole magnetic rings which have an equal number of pole pairs and a common axis of symmetry and which can be connected in a torque-proof manner to the steering shaft, a first and a second magnetic field sensor, wherein in each case one magnetic field sensor is assigned to a multipole magnetic ring, and an evaluation unit which is configured to determine a rotational angle on the basis of the signals of the two magnetic field sensors, wherein the multipole magnetic rings are arranged offset with respect to one another by one pole in the circumferential direction, and the two magnetic field sensors are arranged on the respective outer side of the multipole magnetic ring at the same position in the circumferential direction and at a short distance from one another in the axial direction, and the method comprises the following steps:
  measuring a magnetic field by means of the first magnetic field sensor
  measuring a magnetic field by means of the second magnetic field sensor,
  decomposing the two measured signals into radial and tangential components,
  forming a difference between the two radial components and the two tangential components, and
  determining the rotational angle independently of an external magnetic interference field by means of an arctan function.

It is preferred here if the multipole magnetic rings each have an axial pole width, and the axial distance between the magnetic field sensors is less than 110% and in particular greater than 90% of the axial pole width. The axial distance between the magnetic field sensors is preferably between 40% and 60% of the entire extent of the two multipole magnetic rings in the axial direction. Further preferred configurations can be inferred from the device described above.

FIG. 1 is a schematic illustration of a steering angle sensor unit 1. A multipole magnetic ring 2 surrounds a shaft (not illustrated) concentrically and is connected in a torque-proof manner to this shaft. The multipole magnetic ring 2 has a multiplicity of permanent magnets along its circumference. The arrangement of the magnets 3 is selected such that a north and a south pole are located alternately along the outer edge of the multipole magnetic ring 2. A rotation of the multipole magnetic ring 2 and of the shaft therefore brings about a magnetic field which changes over time and which is sensed by two sensors 4, 5. The two sensors 4, 5 are preferably Hall sensors. They are arranged in a positionally fixed fashion.

The sensors 4, 5 are on the outside of the multipole magnetic ring 2 and are arranged spaced apart from the latter radially with respect to a longitudinal axis 100, across a small airgap 6 for measuring the magnetic field which originates from the multipole magnetic ring 2. The two sensors 4, 5 are arranged at a distance from a pole in the circumferential direction about the longitudinal axis 100. In other words, a first sensor 4 faces a south pole, and a second sensor 5 faces a north pole which is directly adjacent to the south pole. When there are X pole pairs, the sensors 4, 5 are therefore at a distance of 360°/(2*X) in the circumferential direction.

In order to determine the rotational angle, the signals of the two sensors 4, 5 are evaluated in an evaluation unit. In order to be able to measure the rotational angle in a wide-angle range, the evaluation unit is equipped with an incremental counter, so that, when there is a relatively large rotation of the multipole magnetic ring 2, the periods of a generated periodic fluctuation of the magnetic field strength can be counted. Therefore, after initial initialization of the rotational angle any desired rotational angle within an angle range from 0° to 360° can be detected with high accuracy by each of the two sensors 4, 5.

The sensors are so close to one another in a circumferential direction that it can be assumed that an external magnetic interference field is homogeneous in the region of the two sensors. The sensitive sensor faces of the two sensors 40, 50 are in a plane which extends tangentially with respect to the outer face of the multipole magnetic ring 2, in the center between the two sensors 4, 5. The vectorially magnetic flux of the magnetic field which is generated by the multipole magnetic ring 2 encloses the same angle in absolute terms with the plane of the sensor face 40, 50, i.e. $|\alpha|=|\beta|$. The magnetic field which is generated by the multipole magnetic ring in the plane of the two sensor faces 40, 50 is illustrated as a dashed vector 70, 71 in FIG. 1, wherein $\alpha$ is the angle which the vector 71 includes with the perpendicular to the sensor face 50, and $\beta$ is the angle which the vector 70 includes with the perpendicular to the sensor face 40. An external interference field 80, 81 (dotted vectors) and the resulting magnetic field 90, 91 (continuous line) measured by the sensors are also illustrated as a vector. As already explained, it can be assumed that the interference field 80, 81 is the same for both sensors.

Figure 2:
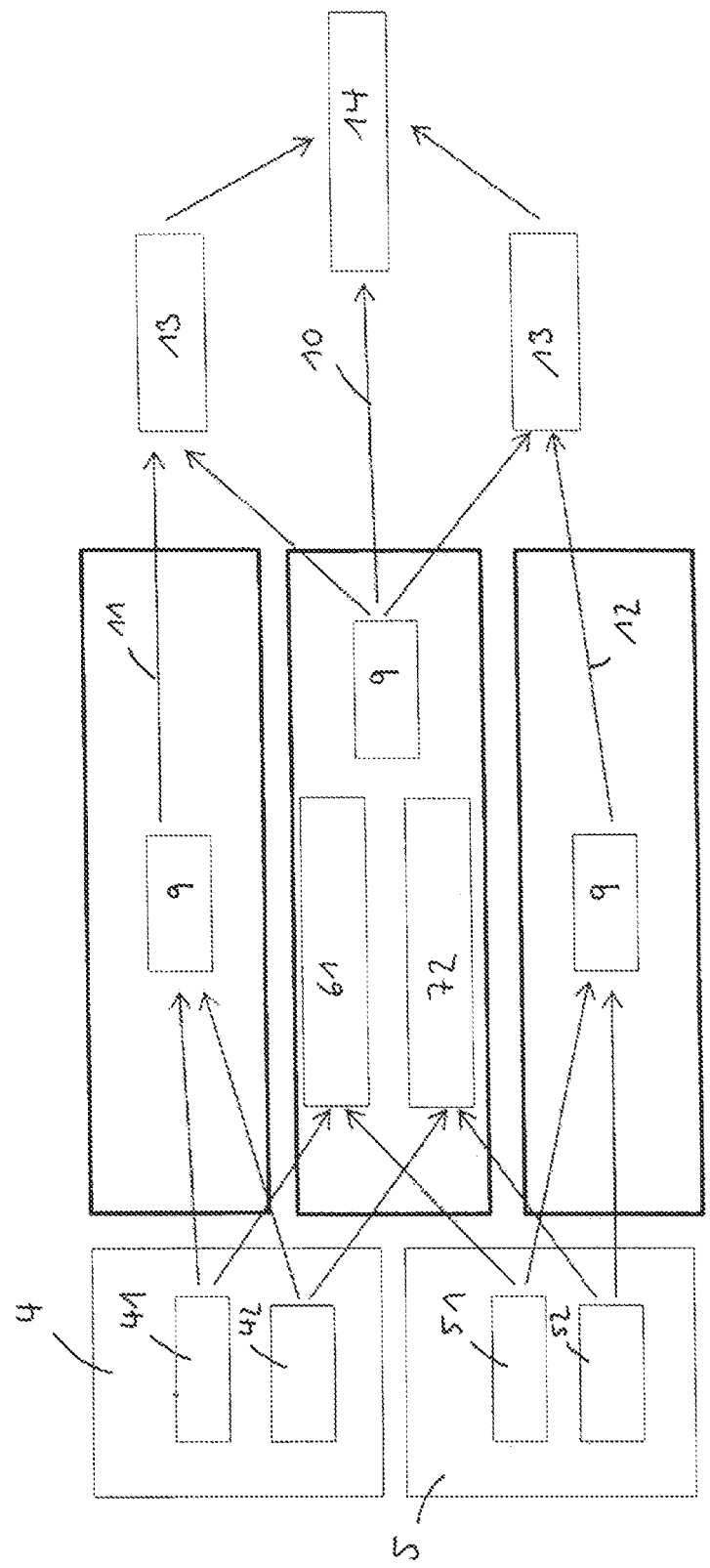
FIG. 2 is a block diagram for calculating a rotational angle by way of the steering angle sensor in FIG. 1.

The signals of the two sensors 4, 5 are decomposed into tangential components 41, 51 and radial components 41, 51, as is illustrated in the block diagram relating to the determination of the rotational angle in FIG. 2. In each case the radial and tangential signal components of the two sensors 41, 51, 41, 51 are extracted 61, 72 from one another in a weighted fashion in order to obtain an interference-free signal. In this context there may be provision to set a delay and an offset in the signals independently of one another. If xMR technology is used as a sensor it is possible to produce complete vectors with estimated strength, so that a weighting can be determined on the basis of the rated flux density.

The corrected rotational angle 10 is then determined by means of the interference-free radial and tangential components 61, 62 using an arctan function 9. In addition, the rotational angle 11, 12 is respectively determined from the signals of the two individual sensors for the cross check 13. The interference-free rotational angel 10 is shifted here by half a pole interval in comparison with the two rotational angles 11, 12 which are determined by means of a single sensor. If the interference-free, corrected rotational angle 13 appears plausible in the cross check, it is passed on to a motor controller 14 of an electric motor. If this is not the case, the conventionally determined rotational angles 11, 12 can also be used for the motor controller. In the case of electro mechanical power steering systems, power steering assistance which is provided by means of the electric motor is determined as a function of the rotational angle. However, there can also be provision to use the steering angle sensor unit in a steer-by-wire steering system.

In order to determine absolute steering angles, a two-pole magnetic ring can be provided in addition to the multipole magnetic ring. The magnetic field of the multipole magnetic ring is, as described, scanned by two sensors, so that an interference-free rotational angle can be determined. So that the angle can be determined absolutely over the entire measuring range from 0° to 360°, the magnetic field of the additional two-pole magnetic ring is sensed by a third sensor. The third sensor is arranged in the direct vicinity of the outer face of the two-pole magnetic ring. The two-pole magnetic ring is arranged spaced apart from the multipole magnetic ring in the direction of the longitudinal axis, so that the magnetic fields do not have a disruptive effect on one another.

Figure 3:
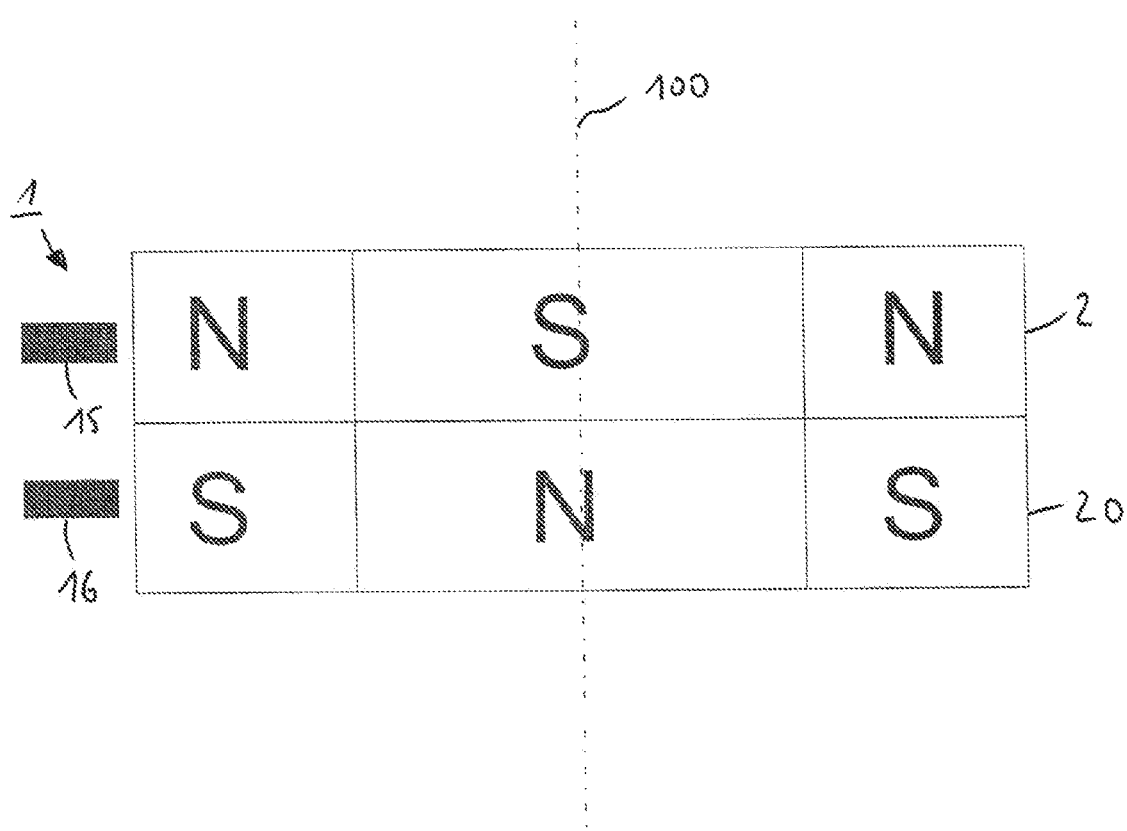
FIG. 3 is a schematic view of another example steering angle sensor with two sensors and two multipole magnetic rings.
Figure 4:
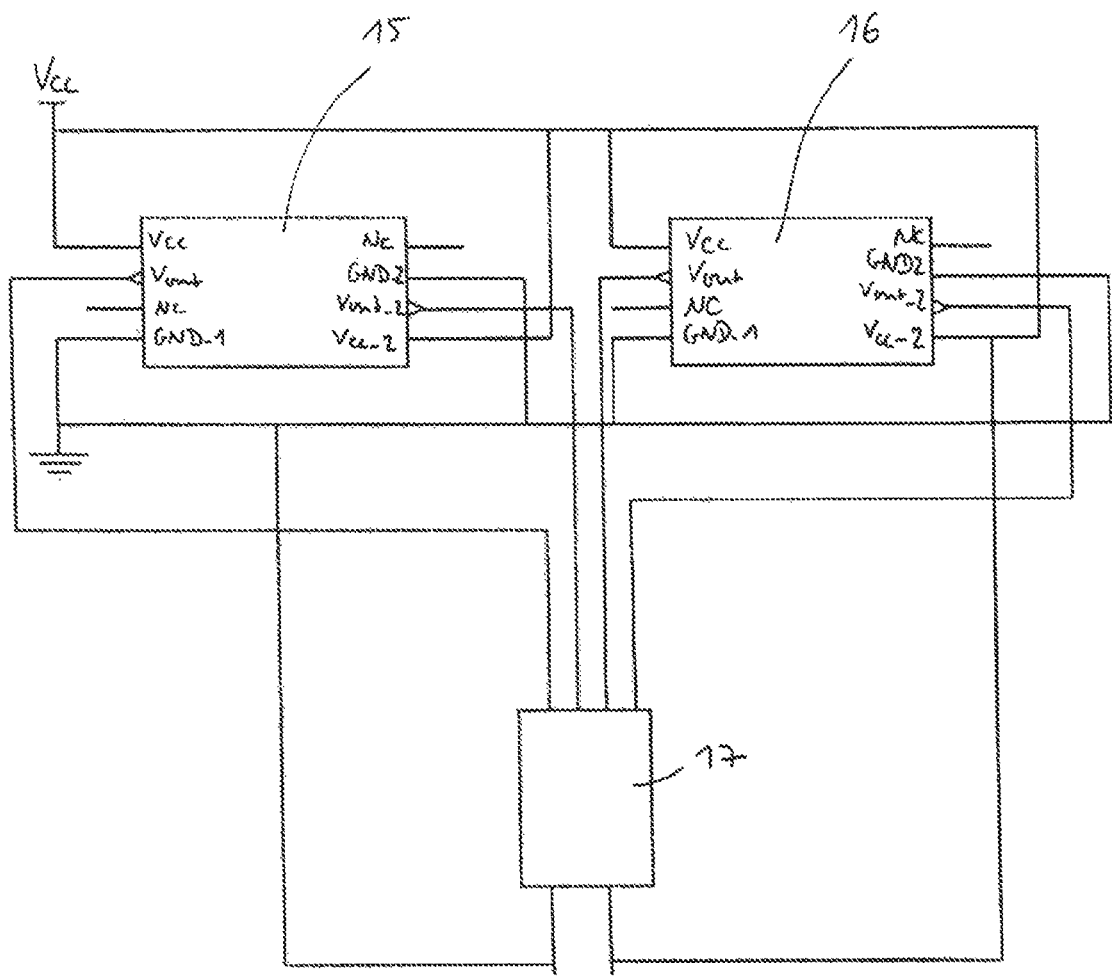
FIG. 4 is an electrical circuit diagram of the steering angle sensor in FIG. 3.

FIG. 3 shows a further embodiment of the steering angle sensor unit 1. Two multipole magnetic rings 2, 20 are provided, which have an equal number of pole pairs which are distributed uniformly over the circumference. Here, the magnetic rings 2, 20 are arranged offset with respect to one another by one pole in the circumferential direction, and are otherwise congruent with respect to the longitudinal axis of the sensor 100. Each magnetic ring 2, 20 generates a separate magnetic field which is measured by a respective sensor 15, 16, preferably a Hall sensor. Here, the two sensors 15, 16 preferably lie with their sensor faces in a plane parallel to the longitudinal axis of the sensor unit 100 and in each case centrally with respect to the corresponding multipole magnetic ring 2, 20. FIG. 4 shows an electrical circuit diagram of the corresponding steering angle sensor unit. The distance between the two sensors 15, 16 is so small that the interference field in the region of the two sensors 15, 16 is homogeneous. Since the vectorial magnetic field which is generated by the two multipole magnetic rings is parallel, with an opposing direction, in the region of the sensitive sensor face of the respective sensor 2, 20, an interference component of an external interference field can be determined by subtracting the two signals. For this, the two sensor signals are each again divided into a tangential component and a radial component. The components are respectively subtracted from one another in a simple microcontroller 17, and the interference-free corrected rotational angle is calculated using an arctan function.

What is claimed is:

1. An angle sensor unit for measuring a rotational angle of a rotational position of a steering shaft of a motor vehicle, the angle sensor unit comprising:
   a multipole magnetic ring that has a number of pole pairs and is connectable in a torque-proof manner to the steering shaft;
   magnetic field sensors that are assigned to the multipole magnetic ring, wherein the magnetic field sensors are offset in a circumferential direction on an outside of the multipole magnetic ring such that a magnetic field originating from the multipole magnetic ring in a region of the magnetic field sensors has an approximate equal absolute value with opposite signs;
   an evaluation unit configured to determine the rotational angle based on signals of the magnetic field sensors; and
   wherein the multipole magnetic ring comprises a two-pole magnetic ring with an assigned magnetic field sensor of the magnetic field sensors for an absolute determination of the rotational angle.

2. The angle sensor unit of claim 1 wherein the magnetic field sensors are spaced apart by less than 45° in the circumferential direction, and wherein the absolute determination of the rotational angle is determined over one revolution of the multipole magnetic ring.

3. The angle sensor unit of claim 1 wherein the magnetic field sensors are spaced apart by less than 20° in the circumferential direction.

4. The angle sensor unit of claim 1 wherein the magnetic field sensors are offset by one pole in the circumferential direction.

5. The angle sensor unit of claim 1 wherein sensitive sensor faces of the magnetic field sensors are in a plane and are spaced apart by a distance in a range between 40% and 90% of a diameter of the multipole magnetic ring.

6. The angle sensor unit of claim 1 wherein the multipole magnetic ring includes at least four pole pairs.

7. The angle sensor unit of claim 1 wherein the evaluation unit is configured to determine the rotational angle independent of an external magnetic interference field by forming differences between the signals of the magnetic field sensors.

8. The angle sensor unit of claim 1 wherein poles of the multipole magnetic ring are formed by permanent magnets.

9. The angle sensor unit of claim 1 wherein the magnetic field sensors are xMR sensors or Hall sensors.

10. An angle sensor unit for measuring a rotational angle of a rotational position of a steering shaft of a motor vehicle, the angle sensor unit comprising:
    multipole magnetic rings that have an equal number of pole pairs, that have a common axis of symmetry, and that are connectable in a torque-proof manner to the steering shaft, wherein the multipole magnetic rings are offset from one another by one pole in a circumferential direction;
    magnetic field sensors, wherein each magnetic field sensor is assigned to one of the multipole magnetic rings, wherein the magnetic field sensors are disposed on a respective outer side of each multipole magnetic ring at a same position in the circumferential direction and at an axial distance from one another in an axial direction;
    an evaluation unit configured to determine the rotational angle based on signals of the magnetic field sensors; and
    wherein the multipole magnetic rings include a first multipole magnetic ring and a second multipole magnetic ring, each multipole magnetic ring comprising a two-pole magnetic ring with an assigned magnetic field sensor of the magnetic field sensors for an absolute determination of the rotational angle.

11. The angle sensor unit of claim 10 wherein the multipole magnetic rings each have an axial pole width, wherein the axial distance between the magnetic field sensors is less than 110% of the axial pole width.

12. The angle sensor unit of claim 11 wherein the axial distance between the magnetic field sensors is greater than 90% of the axial pole width.

13. The angle sensor unit of claim 10 wherein the axial distance between the magnetic field sensors is between 40% to 60% of a total extent of the multipole magnetic rings in the axial direction.

14. A method for determining a rotational angle of a rotational position of a rotatably mounted steering shaft of a motor vehicle with an angle sensor unit that includes a multipole magnetic ring comprising a two-pole magnetic ring that has a number of pole pairs and is connectable in a torque-proof manner to the steering shaft, first and second magnetic field sensors that are assigned to the multipole magnetic ring, and an evaluation unit that is configured to determine an absolute determination of the rotational angle based on signals of the magnetic field sensors, wherein the magnetic field sensors are offset in a circumferential direction on an outside of the multipole magnetic ring, the method comprising:
    introducing the angle sensor unit into a magnetic interference field;
    positioning the magnetic field sensors on an outer side of the multipole magnetic ring such that the magnetic interference field is generally homogeneous in a region of the magnetic field sensors and such that a magnetic field that originates from the multipole magnetic ring has in the region of the magnetic field sensors an approximately equal absolute value with opposite signs;
    measuring a magnetic field with the first magnetic field sensor;
    measuring a magnetic field with the second magnetic field sensor;
    decomposing measured signals from the first and second magnetic field sensors into radial and tangential components;
    forming a difference between the radial components and the tangential components; and
    determining the rotational angle independently of an external magnetic interference field by way of an arctan function.

15. The method of claim 14 comprising performing weighting when forming the difference.

16. The method of claim 14 wherein the magnetic field sensors are offset by one pole in the circumferential direction, and wherein the rotational angle is determined over one revolution of the multipole magnetic ring.

17. A method for determining a rotational angle of a rotational position of a rotatably mounted steering shaft of a motor vehicle with an angle sensor unit that includes two multipole magnetic rings including a first multipole magnetic ring and a second multipole magnetic ring, that both have an equal number of pole pairs and a common axis of symmetry and are connectable in a torque-proof manner to the steering shaft, first and second magnetic field sensors that are assigned respectively to the multipole magnetic rings, and an evaluation unit that is configured to determine the rotational angle based on signals of the magnetic field sensors, wherein the multipole magnetic rings are offset with respect to one another by one pole in a circumferential direction, wherein the magnetic field sensors are disposed on a same outer side of the multipole magnetic rings at a same position in a circumferential direction and at an axial distance from one another in an axial direction, the method comprising:

measuring a first magnetic field with the first magnetic field sensor;

measuring a second magnetic field with the second magnetic field sensor;

decomposing signals measured by the magnetic field sensors into radial and tangential components;

forming a difference between the radial components and the tangential components; and determining the rotational angle independent of an external magnetic interference field by way of an arctan function.

18. The method of claim 17 wherein the multipole magnetic rings each have an axial pole width, wherein the axial distance between the magnetic field sensors is less than 110% of the axial pole width.

19. The method of claim 18 wherein the axial distance between the magnetic field sensors is greater than 90% of the axial pole width.

20. The method of claim 17 wherein the axial distance between the magnetic field sensors is between 40% to 60% of an entire extent of the multipole magnetic rings in the axial direction.

* * * * *